(12) United States Patent
Jeong

(10) Patent No.: US 10,366,773 B2
(45) Date of Patent: Jul. 30, 2019

(54) E-FUSE CIRCUIT

(71) Applicant: SK hynix Inc., Icheon-si Gyeonggi-do (KR)

(72) Inventor: Hyeong Soo Jeong, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 8 days.

(21) Appl. No.: 15/623,694

(22) Filed: Jun. 15, 2017

(65) Prior Publication Data

US 2018/0197621 A1    Jul. 12, 2018

(30) Foreign Application Priority Data

Jan. 11, 2017   (KR) .................. 10-2017-0004309

(51) Int. Cl.
| | |
|---|---|
| *G11C 29/00* | (2006.01) |
| *G11C 29/02* | (2006.01) |
| *G11C 29/44* | (2006.01) |
| *G11C 29/46* | (2006.01) |
| *G11C 17/16* | (2006.01) |

(52) U.S. Cl.
CPC ............ *G11C 29/76* (2013.01); *G11C 29/027* (2013.01); *G11C 29/44* (2013.01); *G11C 29/46* (2013.01); *G11C 29/814* (2013.01); *G11C 29/822* (2013.01); *G11C 17/16* (2013.01)

(58) Field of Classification Search
CPC ........ G11C 29/76; G11C 17/16; G11C 29/027
USPC .......................................................... 365/96
See application file for complete search history.

(56) References Cited

U.S. PATENT DOCUMENTS

| | | | | |
|---|---|---|---|---|
| 9,508,456 B1* | 11/2016 | Shim | ...................... | G11C 29/78 |
| 2007/0133323 A1* | 6/2007 | Kim | ....................... | G11C 7/24 |
| | | | | 365/200 |
| 2009/0059682 A1 | 3/2009 | Park et al. | | |
| 2010/0238741 A1* | 9/2010 | Miyatake | .............. | G11C 17/18 |
| | | | | 365/189.05 |
| 2010/0254205 A1* | 10/2010 | Yamauchi | ............. | G11C 17/16 |
| | | | | 365/200 |
| 2013/0322149 A1* | 12/2013 | Ryu | .................... | G11C 7/1045 |
| | | | | 365/96 |
| 2015/0128000 A1* | 5/2015 | Jung | ................... | G06F 11/2268 |
| | | | | 714/723 |
| 2016/0180969 A1* | 6/2016 | Noh | ....................... | G11C 29/78 |
| | | | | 365/96 |
| 2016/0217873 A1 | 7/2016 | Noh | | |

* cited by examiner

*Primary Examiner* — Hoai V Ho
*Assistant Examiner* — Muna A Techane
(74) *Attorney, Agent, or Firm* — William Park & Associates Ltd.

(57) ABSTRACT

An electrical fuse (E-fuse) circuit is disclosed, which relates to a technology for processing a failed part of the E-fuse circuit. The E-fuse circuit comprising: a boot-up controller configured to generate at least one fuse address and a sensing enable signal, an electrical fuse (E-fuse) array configured to include a plurality of fuse sets, and configured to output fuse data including failed data if a failure has occurred in an E-fuse of the plurality of fuse sets, based on the fuse address and the sensing enable signal, a fail controller configured to detect failed data from the fuse data, and output a failed signal and a failed address storage circuit configured to store a failed address from among the fuse addresses based on the failed signal.

20 Claims, 5 Drawing Sheets

E-FUSE CIRCUIT

CROSS-REFERENCE TO RELATED APPLICATION

This application claims priority based upon Korean patent application No. 10-2017-0004309, filed on Jan. 11, 2017, the disclosure of which is hereby incorporated in its entirety by reference herein.

BACKGROUND

1. Technical Field

Embodiments of the present disclosure may generally relate to an E-fuse circuit, and more particularly to a technology for processing a failed part of the E-fuse circuit.

2. Related Art

A Dynamic Random Access Memory (DRAM) is constructed by a plurality of memory cells. The plurality of memory cells are arranged in the form of a matrix. If a fail occurs even in one memory cell among a plurality of memory cells, a semiconductor memory device is sorted out as a bad product since it cannot properly perform a certain operation. The probability of a failed cell occurring increases with higher degrees of integration and higher operation speeds within a semiconductor memory device.

Therefore, a yield that is defined as the ratio of the number of good chips to the total number of chips and serves to determine a manufacturing cost is likely to decrease. Thus, research is being performed for finding not only new methods related to obtaining higher degrees of integration and higher operating speeds for a semiconductor memory devices but also for methods for efficiently repairing a failed cell to try and increase a yield.

As a method for repairing a failed cell, a technology of building in a repair circuit for replacing a failed cell with a redundancy cell is being used. In general, a repair circuit consists of redundancy columns/rows which are arranged in columns and rows each constructed by redundancy memory cells. A redundancy column/row is selected instead of a column/row in which a fail has occurred.

That is to say, if a row and/or column address signal which designates a failed cell is input, a redundancy column/row is selected instead of a failed column/row of a normal memory cell bank.

Generally, in order to represent an address which designates a failed cell, a plurality of fuses to be cut is disposed. The address of the failed cell is programmed as the plurality of fuses are selectively cut.

SUMMARY

In accordance with an embodiment of the present disclosure, an electrical fuse (E-fuse) circuit may be provided. The E-fuse circuit may be configured to detect failed data and or store a failed address.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing an E-fuse circuit that substantially obviates one or more problems due to limitations and disadvantages of the related art.

An embodiment of the present disclosure may generally relate to a technology for detecting and storing (detecting/storing) a failed part of the E-fuse during a boot-up operation, and processing the failed part of the E-fuse after completion of the boot-up operation.

Figure 1:
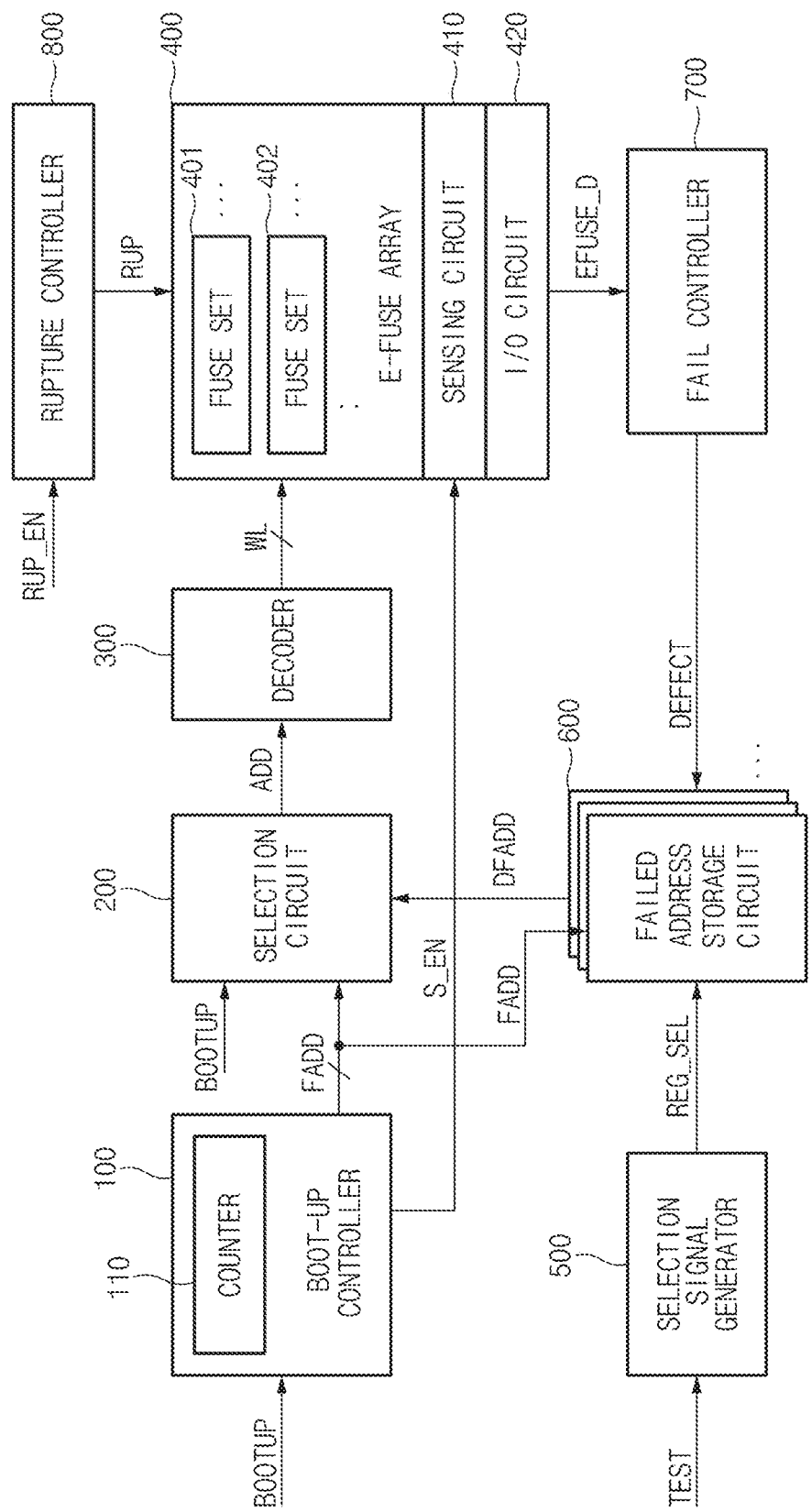
FIG. 1 is a block diagram illustrating a representation of an example of an E-fuse circuit according to an embodiment of the present disclosure.

FIG. 1 is a block diagram illustrating an E-fuse circuit according to an embodiment of the present disclosure.

Referring to FIG. 1, the E-fuse circuit may include a boot-up controller 100, a selection circuit 200, a decoder 300, an electrical fuse (E-fuse) array 400, a sensing circuit 410, an input and output (input/output) (I/O) circuit 420, a selection signal generator 500, a failed address storage circuit 600, a fail controller 700, and a rupture controller 800.

The boot-up controller 100 may initiate the boot-up operation according to a boot-up signal BOOTUP after completion of the power-up operation. The boot-up controller 100 may include a counter 110 therein, and may output a fuse address FADD indicating the position of a fuse line to the selection circuit 200 and the failed address storage circuit 600 in response to a counting operation of the counter 110. Here, the fuse address FADD may be sequentially increased by the counter 110. The boot-up controller 110 may output a sensing enable signal S_EN, needed to control the sensing circuit 410, to the sensing circuit 410.

For example, the boot-up operation may be an operation for scanning fuse data regarding a failed address stored in the electrical fuse (E-fuse) of the E-fuse array 400, prior to execution of a memory operation after completion of the power-up operation. That is, during the boot-up operation, prior to operation of the memory, information of the fuse sets 401 and 402 contained in the E-fuse array 400 may be transmitted to a redundancy circuit (not illustrated) of the memory (not illustrated).

The selection circuit 200 may select a fuse address FADD or a failed address DFADD in response to a boot-up signal BOOTUP. That is, if the boot-up signal BOOTUP is activated in a boot-up operation section, the selection circuit 200 may select the fuse address FADD, and may output the selected fuse address FADD as the address ADD. In other words, if the boot-up signal BOOTUP is deactivated after lapse of the boot-up operation section, the selection circuit 200 may select the failed address DFADD, and may output the selected failed address as the address ADD. The decoder 300 may decode the address ADD, and may selectively activate the word line WL for selecting the fuse sets 401 and 402. In an embodiment, for example, the selection circuit 200 may be configured to select the fuse data EFUSE_D and output the selected fuse data EFUSE_D as an address ADD within an activation section of the boot-up signal BOOTUP, and may be configured to select the failed address DFADD and output the selected failed address DFADD as the address ADD within a deactivation section of the boot-up signal.

The E-fuse array 400 may include a plurality of fuse sets 401 and 402, each of which includes E-fuse lines. The E-fuse array 400 may store information regarding respective bits of all failed addresses in each of the fuse sets 401 and 402. In this case, each of the fuse sets 401 and 402 may be comprised of an E-fuse configured to program information by melting or blowing the fuse using overcurrent.

If a fuse line of the corresponding address is activated in response to activation or deactivation of a word line WL indicating fuse selection information, the E-fuse array 400 may output fuse data of the selected fuse set 401 or 402 to the sensing circuit 410.

The E-fuse array 400 may output fuse information to the memory after completion of memory testing. The E-fuse array 400 may rupture the E-fuse of each fuse set 401 or 402 corresponding to each bit in response to a rupture signal RUP, and may permanently store fail information therein.

The sensing circuit 410 may sense bit information stored in each fuse set 401 or 402 of the E-fuse array 400 during the read operation. The sensing circuit 410 may perform the sensing operation upon receiving the sensing enable signal S_EN from the boot-up controller 100, and may output the sensed data to the I/O circuit 420. For example, the sensing circuit 410 may sequentially sense data stored in the plurality of fuse sets 401 and 402 in response to the sensing enable signal S_EN.

The first fuse set 401 may be selected in response to the first fuse address FADD received from the boot-up controller 100, and data of the first fuse set 401 may be selected in response to the sensing enable signal S_EN. Thereafter, the second fuse set 402 may be selected in response to a second fuse address FADD received from the boot-up controller 100, and data of the second fuse set 402 may be sensed in response to the sensing enable signal S_EN.

The I/O circuit 420 may drive data received from the sensing circuit 410, and may output fuse data EFUSE_D to the fail controller 700. Although not illustrated in the drawings, the I/O circuit 420 may drive write data received from the external part, and may output the driven write data to the sensing circuit 410.

The selection signal generator 500 may generate a selection signal REG_SEL for selecting any one of the plurality of failed address storage circuits 600 in response to a test signal TEST. For example, the selection signal generator 500 may deactivate the selection signal REG_SEL when the test signal TEST is deactivated in the boot-up operation section. However, in an embodiment for example, the selection signal generator 500 may activate the selection signal REG_SEL for loading fail information of the failed address storage circuit 600 when the test signal TEST is activated after lapse of the boot-up operation section. In an embodiment, for example, the test signal TEST may be activated in a deactivation section of the boot-up signal BOOTUP.

In addition, the failed address storage circuit 600 may receive a fuse address FADD during the boot-up operation. During activation of a failed signal DEFECT, the failed address storage circuit 600 may store position information regarding the failed address DFADD contained in the fuse address FADD.

The failed address storage circuit 600 may store the failed address DFADD regarding the fuse address FADD in response to the failed signal DEFECT during the boot-up operation. After completion of the boot-up operation, the failed address DFADD stored in the failed address storage circuit 600 selected by activation of the selection signal REG_SEL may be output to the selection circuit 200.

The plurality of failed address storage circuits 600 may be used. If plural failed address storage circuits 600 are used, a single failed address DFADD may be stored in a single block.

Although an embodiment of the present disclosure has disclosed, for example, that plural failed address storage circuits 600 are used such that one failed information is stored in one block for convenience of description, the scope or spirit of the present disclosure is not limited thereto, and the embodiments may also use only one failed address storage circuit 600 as necessary. In an embodiment, for example, the number of failed address storage circuits 600 may be a plural number.

The plurality of failed address storage circuits 600 may be sequentially activated in response to the selection signal REG_SEL. If the word line WL is activated in response to the failed address DFADD after lapse of the boot-up operation, the E-fuse array 400 may perform masking of the operation in which the fuse set 401 or 402 corresponding to the failed address DFADD is used.

For example, the first failed address storage circuit 600 is activated after completion of the boot-up operation, such that the failed address DFADD is output to the selection circuit 200. The selection circuit 200 may select the first failed address DFADD to output the address ADD. Thereafter, the decoder 300 may activate the word line WL according to the address ADD. In addition, the operation in which the first failed fuse set 401 is used when the rupture signal RUP is activated may be masked.

The second failed address storage circuit 600 is activated, such that a failed address DFADD may be output to the selection circuit 200. The selection circuit 200 may select the second failed address DFADD and then output the address ADD. Subsequently, the decoder 300 may activate the corresponding word line WL according to the address ADD. In the case of activation of the rupture signal RUP, the second failed fuse set 402 may be masked.

The fail controller 700 may detect failed data from fuse data EFUSE_D received from the E-fuse array 400 through the sensing circuit 410 and the I/O circuit 420, and may generate a failed signal DEFECT.

During the initial boot-up operation, each fuse set 401 or 402 of the E-fuse array 400 may not be fused. If a fail occurs in the E-fuse of the fuse set 401 or 402, failed data may occur in the fuse data EFUSE_D. The fuse data EFUSE_D must be output as non-fused bit information. If fuse data EFUSE_D includes fusing information, this means that a failed part occurs in the E-fuse, resulting in occurrence of failed data.

If failed data occurs in the boot-up operation, the fail controller 700 generates the failed signal DEFECT, and outputs the generated failed signal DEFECT to the failed address storage circuit 600. The fail controller 700 may compare bit information of the fuse data EFUSE_D received from the fuse sets 401 and 402, and may thus determine the presence or absence of failed data. That is, if the fail controller 700 receives any other bit information from among fuse data EFUSE_D, the fail controller 700 determines the presence of failed data and thus activates the failed signal DEFECT.

The rupture controller 800 may output the rupture signal RUP to the E-fuse array 400 in response to the rupture enable signal RUP_EN. The E-fuse array 400 may perform masking in a manner that failed fuse sets 401 and 402 are not used according to the rupture operation during activation of the rupture signal RUP. In an embodiment, for example, the rupture controller 800 may be activated in a deactivation section of the boot-up signal BOOTUP.

As described above, an embodiment, for example, may sequentially load information of all the failed address storage circuits 600, and may perform masking of the operation in which the fuse sets 401 and 402 corresponding to the failed address DFADD are used.

As described above, if the boot-up controller 100 generates the fuse address FADD during the boot-up operation section, an embodiment of the present disclosure, for example, selects the fuse address FADD and thus outputs the address ADD. The decoder 300 decodes the address ADD to selectively activate the word line WL. Data of the E-fuse data 400 is read in response to the sensing enable signal S_EN, such that fuse data (EFUSE_D) is output to the fail controller 700. If failed data occurs in the fuse data EFUSE_D, the fail controller 700 activates the failed signal DEFECT and stores the activated failed signal DEFECT in the failed address storage circuit 600.

Thereafter, if the test signal TEST is activated after completion of the boot-up operation section, failed data DFADD of the failed address storage circuit 600 selected according to the selection signal REG_SEL may be output to the selection circuit 200. The selection circuit 200 may select the failed address DFADD, and may thus output the address ADD. The decoder 300 may selectively activate the word line WL by decoding the address ADD. If the decoder 300 receives the rupture signal RUP from the rupture controller 800, the fuse sets 401 and 402 selected by the word line WL may be masked.

Figure 2:
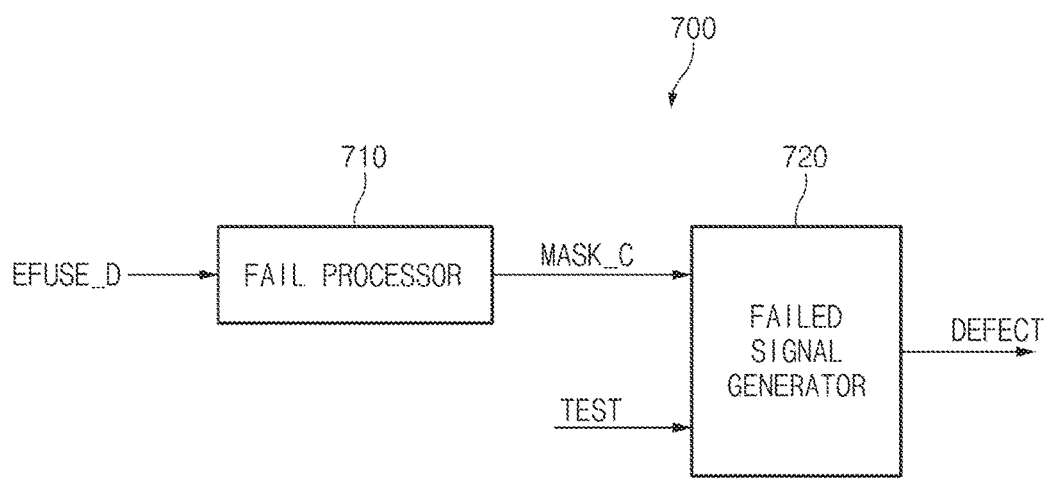
FIG. 2 is a block diagram illustrating a representation of an example of a fail controller illustrated in FIG. 1.

FIG. 2 is a block diagram illustrating a representation of an example of the fail controller 700 illustrated in FIG. 1.

Referring to FIG. 2, the fail controller 700 may include a fail processor 710 and a failed signal generator 720.

The fail processor 710 may process fuse data EFUSE_D, and may thus output a masking control signal MASK_C. The fail processor 710 may activate the masking control signal MASK_C when failed data from among the fuse data EFUSE_D occurs. The failed signal generator 720 may output a pulse-shaped failed signal DEFECT in response to the masking control signal MASK_C when the test signal TEST is activated.

For example, the fail processor 710 may perform a comparison between bit information of the fuse data EFUSE_D, and may then determine the presence or absence of failed data according to the result of comparison. For example, if all bit information of the fuse data EFUSE_D is set to "1", the fail processor 710 may determine the absence of failed data. For example, if bit information "0" of the fuse data EFUSE_D is applied to the fail processor 710, the fail processor 710 determines the presence of failed data, and activates the failed signal DEFECT.

The memory device may repair a failed cell using the E-fuse. If the memory device uses the E-fuse, the memory device performs the repair operation by accessing a redundancy region. If the memory device does not use the E-fuse, the memory device may perform the normal operation by accessing a normal region.

However, when a failed part occurs in the E-fuse, a normal repair operation is not performed. That is, assuming that an initial fail occurs in the E-fuse of the fuse sets 401 and 402, although the corresponding E-fuse is not used, there occurs an abnormal operation in which there is an undesired redundancy replacement or a repair address change is performed.

Therefore, if the E-fuse having a failed part is detected by reading a current state of the E-fuse, the failed E-fuse must be processed in advance to prevent the failed E-fuse from being used. For this purpose, a test time for reading states of all the E-fuses one by one is additionally needed. In association with information as to whether the E-fuse has a failed part, a state of the corresponding E-fuse may be read and recognized. Although the E-fuse is not actually used, if information indicating the used E-fuse is read, this means that the corresponding E-fuse has a failed part.

However, if an additional memory is not mounted to the device for testing the memory device, it may be impossible to store position information of the failed E-fuse as well as to process the failed part of the E-fuse. Although the memory is contained in the test device, it takes a long test time to read the E-fuse state.

Therefore, during the initial boot-up operation of the memory device, an embodiment may read information indicating the presence or absence of a failed part in the E-fuse array 400, such that position information of the failed fuse set 401 or 402 may be stored in the failed address storage circuit 600. After completion of the boot-up operation, an embodiment may sequentially access the failed fuse sets 401 and 402 on the basis of failed address information stored in the failed address storage circuit 600, and may perform masking to prevent the failed E-fuse from being used.

Figure 3:
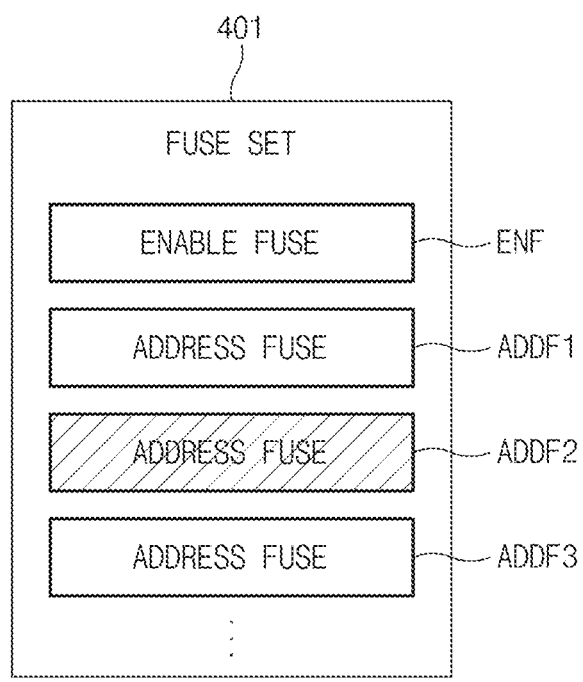
FIG. 3 is a block diagram illustrating a representation of an example of a fuse set illustrated in FIG. 1.

FIG. 3 is a block diagram illustrating a representation of an example of the fuse set 401 illustrated in FIG. 1. A detailed structure of the fuse set 401 is identical to that of the fuse set 402 according to an embodiment of the present disclosure, such that a description of the first fuse set 401 will hereinafter be described as an example.

The fuse set 401 may include a single enable fuse ENF and a plurality of address fuses ADDF1~ADDF3. In this case, the enable fuse ENG may be used to enable the fuse set 401. The plurality of address fuses ADDF1~ADDF3 may store address information therein.

An embodiment may assume, for example, that a failed part occurs in the first fuse set 401 in response to the failed address DFADD. For example, an embodiment may assume that a failed fuse of the first fuse set 401 is any one of the plurality of address fuses ADDF1~ADDF3.

As a result, the enable fuse ENF of the first fuse set 401 may be enabled by the word line WL. Since failed data occurs in the first fuse set 401 (i.e., at address fuse ADDF2), the use of the fuse set 401 must be masked. Accordingly, if the rupture signal RUP is activated, a predetermined address fuse (e.g., the second address fuse ADDF2) from among the plurality of address fuses ADDF1~ADDF3 is blown or cut such that the masking operation for preventing the fuse set 401 from being used is performed.

An embodiment of the present disclosure has disclosed, for example, that a predetermined address fuse from among the plurality of address fuses ADDF1~ADDF3 is blown or severed when a failed part occurs. However, the scope or spirit of the present disclosure is not limited thereto, and the embodiments may include an additional masking fuse set such that the embodiments can also perform masking by blowing or severing the masking fuse set.

Figure 4:
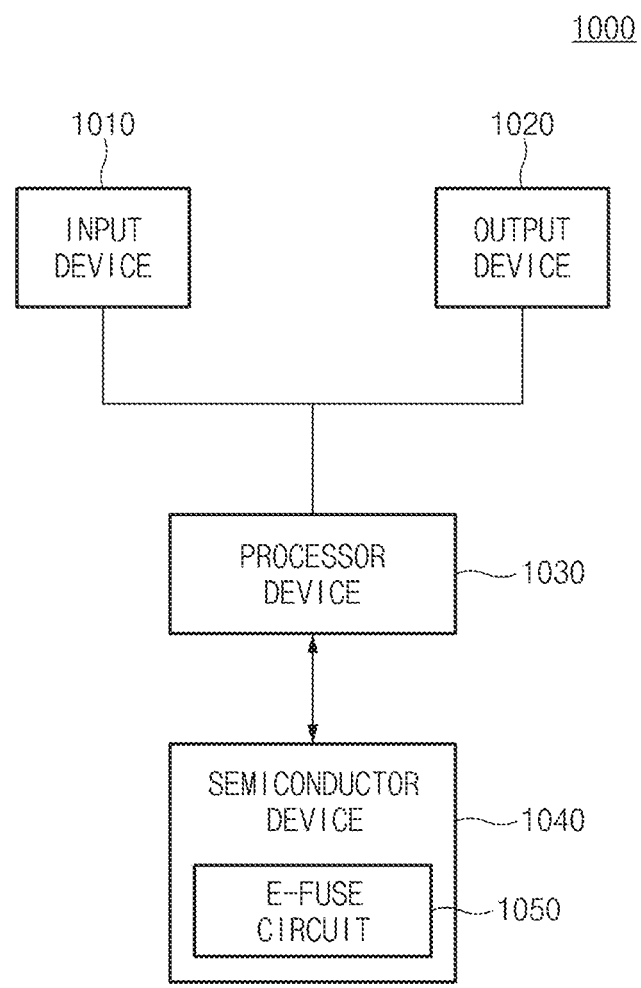
FIG. 4 is a block diagram illustrating an application example of an electronic system including the E-fuse circuit according to an embodiment of the present disclosure.

FIG. 4 is a block diagram illustrating an application example of an electronic system including the E-fuse circuit according to an embodiment of the present disclosure.

Referring to FIG. 4, the electronic system 1000 may include an input device 1010, an output device 1020, a processor device 1030, and a semiconductor device 1040. In this case, the processor device 1030 may control the input device 1010, the output device 1020, and the semiconductor device 1040 through the corresponding interfaces.

The processor device 1030 may include at least any one of at least one microprocessor, at least one digital signal processor, at least one microcontroller, and logic circuits capable of performing the same or similar functions as these components.

The input device 1010 may include at least one selected among a keyboard, a mouse, a keypad, a touchscreen, a scanner, and so forth. The output device 1020 may include at least one selected among a monitor, a speaker, a printer, a display device, and so forth. The semiconductor device 1040 may include the E-fuse circuit 1050 described in the aforementioned embodiments.

Figure 5:
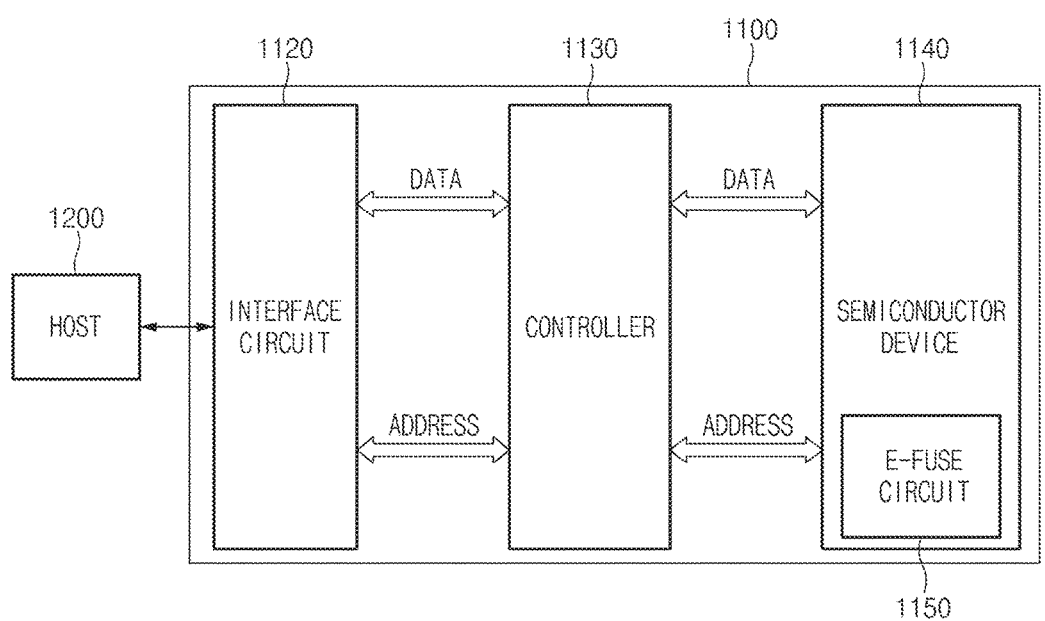
FIG. 5 is a block diagram illustrating a representation of an example of a memory system based on the E-fuse circuit according to an embodiment of the present disclosure.

FIG. 5 is a block diagram illustrating a representation of an example of a memory system using the semiconductor devices according to the embodiments of the present disclosure.

Referring to FIG. 5, the memory system 1100 may include a semiconductor device 1140, an interface circuit 1120, and a controller 1130.

The interface circuit 1120 may provide interfacing between the memory system 1110 and the host 1200. The interface circuit 1120 may include a data exchange protocol corresponding to the host 1200 to interface with the host 1200.

The interface circuit 1120 may be configured to communicate with the host 1200 through one of various interface protocols, for example, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address from an external part through the interface circuit 1120. The controller 1130 may access the semiconductor device 1140 by referring to data and address received from the host 1200. The controller 1130 may transfer data read from the semiconductor device 1140 to the host 1200 through the interface circuit 1120.

The semiconductor device 1140 may include the E-fuse circuits 1150 illustrated in FIGS. 1 to 3. The semiconductor device 1140 may be used as a storage medium of the memory system 1100.

The memory system 1100 illustrated in FIG. 5 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCMCIA) card, a chip card, a USB card, a smart card, a Compact Flash (CF) Card, etc.

As is apparent from the above description, the embodiments of the present disclosure can detect and store a failed part of the E-fuse during the boot-up operation, and can increase a production yield by processing the failed part of the E-fuse after completion of the boot-up operation, resulting in reduction of an E-fuse test time.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An electrical fuse (E-fuse) circuit comprising:
   a boot-up controller configured to generate at least one fuse address and a sensing enable signal based on a boot-up signal;
   an electrical fuse (E-fuse) array configured to include a plurality of fuse sets, and output fuse data having defect fusing information of the plurality of fuse sets when a word line corresponding to the fuse address is activated;
   a fail controller configured to detect failed data from the fuse data, and activate a failed signal when the failed data is detected wherein the failed data is defect of an E-fuse included in the plurality of fuse sets; and
   a failed address storage circuit configured to store a failed address corresponding to a fuse-set in which a defect is detected from among the fuse addresses when the failed signal is activated,
   wherein the defect fusing information indicates that a failed part has occurred in the E-fuse of the fuse set resulting in the occurrence of the failed data,
   wherein the fail controller includes:
   a fail processor configured to activate a masking control signal when the failed data is detected from the fuse data; and
   a failed signal generator configured to generate the failed signal based on the masking control signal during activation of a test signal.

2. The electrical fuse (E-fuse) circuit according to claim 1, wherein the boot-up controller further includes:
   a counter configured to sequentially generate the fuse addresses by counting the boot-up signal.

3. The electrical fuse (E-fuse) circuit according to claim 1, further comprising:
   a sensing circuit configured to sense data of the E-fuse array based on the sensing enable signal.

4. The electrical fuse (E-fuse) circuit according to claim 3, wherein the sensing circuit is configured to sequentially sense data of the plurality of fuse sets based on the sensing enable signal.

5. The electrical fuse (E-fuse) circuit according to claim 1, further comprising:

an input and output (input/output) (I/O) circuit configured to output the fuse data by driving output data of the sensing circuit.

6. The electrical fuse (E-fuse) circuit according to claim 1, further comprising:
a selection circuit configured to select the fuse data and output the selected fuse data as an address within an activation section of the boot-up signal, and configured to select the failed address and output the selected failed address as the address within a deactivation section of the boot-up signal.

7. The electrical fuse (E-fuse) circuit according to claim 6, further comprising:
a decoder configured to selectively activate the word line by decoding the address.

8. The electrical fuse (E-fuse) circuit according to claim 1, wherein the fail processor is configured to identify the failed data by comparing bit information of the fuse data with each other.

9. The electrical fuse (E-fuse) circuit according to claim 1, further comprising:
a rupture controller configured to control a rupture operation of a selected fuse set when a word line corresponding to the failed address is activated.

10. The electrical fuse (E-fuse) circuit according to claim 9, wherein the rupture controller is activated in a deactivation section of the boot-up signal.

11. The electrical fuse (E-fuse) circuit according to claim 1, wherein:
a number of a failed address storage circuits is a plural number; and
the E-fuse circuit further includes:
a selection signal generator configured to generate a selection signal for selecting any one of the plurality of failed address storage circuits based on a test signal.

12. The electrical fuse (E-fuse) circuit according to claim 11, wherein the test signal is activated in a deactivation section of the boot-up signal.

13. The electrical fuse (E-fuse) circuit according to claim 1, wherein each of the plurality of fuse sets includes:
an enable fuse configured to enable any one of the plurality of fuse sets; and
a plurality of address fuses configured to store address information.

14. The electrical fuse (E-fuse) circuit according to claim 13, wherein each of the plurality of fuse sets is configured in a manner that a predetermined specific address fuse from among the plurality of address fuses is blown or severed during the rupture operation.

15. An electrical fuse (E-fuse) circuit comprising:
a boot-up controller configured to generate at least one fuse address and a sensing enable signal;
an electrical fuse (E-fuse) array configured to include a plurality of fuse sets, and configured to output fuse data including failed data if a failure has occurred in an E-fuse of the plurality of fuse sets, based on the fuse address and the sensing enable signal;
a fail controller configured to detect failed data from the fuse data, and activate a failed signal when the failed data is detected wherein the failed data is defect of an E-fuse included in the plurality of fuse sets; and
a failed address storage circuit configured to store a failed address corresponding to a fuse-set in which a defect is detected from among the fuse addresses based on the failed signal,
wherein the defect fusing information indicates that a failed part has occurred in the E-fuse of the fuse set resulting in the occurrence of the failed data,
wherein the fail controller includes:
a fail processor configured to activate a masking control signal when the failed data is detected from the fuse data; and
a failed signal generator configured to generate the failed signal based on the masking control signal during activation of a test signal.

16. The E-fuse circuit according to claim 15, wherein the boot-up controller is configured to generate the at least one fuse address and the sending enable signal based on a boot-up signal.

17. The E-fuse circuit according to claim 15, wherein the failed data is detected during a boot-up operation.

18. The E-fuse circuit according to claim 15, wherein the failed address is stored during a boot-up operation.

19. The E-fuse circuit according to claim 15, wherein the boot-up controller is configured to generate the at least one fuse address and the sending enable signal after completion of a power-up operation and prior to execution a memory operation.

20. The E-fuse circuit according to claim 1, wherein the failed data is detected during a boot-up operation.

* * * * *